US010425084B2

(12) United States Patent
Kaajakari

(10) Patent No.: US 10,425,084 B2
(45) Date of Patent: Sep. 24, 2019

(54) OVEN CONTROLLED MEMS OSCILLATOR AND SYSTEM AND METHOD FOR CALIBRATING THE SAME

(71) Applicant: Murata Manufacturing Co., Ltd., Nagaokakyo-shi, Kyoto-fu (JP)

(72) Inventor: Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 68 days.

(21) Appl. No.: 15/723,590

(22) Filed: Oct. 3, 2017

(65) Prior Publication Data

US 2019/0103874 A1    Apr. 4, 2019

(51) Int. Cl.

| H03B 5/04 | (2006.01) |
| H03B 5/30 | (2006.01) |
| H03H 3/007 | (2006.01) |
| H03H 9/08 | (2006.01) |
| H03H 9/24 | (2006.01) |
| H03L 1/04 | (2006.01) |
| H03L 1/02 | (2006.01) |
| H03H 9/02 | (2006.01) |
| H03B 5/32 | (2006.01) |

(52) U.S. Cl.
CPC ............... *H03L 1/027* (2013.01); *H03B 5/04* (2013.01); *H03B 5/32* (2013.01); *H03H 3/0077* (2013.01); *H03H 9/02102* (2013.01); *H03H 9/02448* (2013.01); *H03H 9/08* (2013.01); *H03H 9/2405* (2013.01); *H03L 1/02* (2013.01); *H03L 1/026* (2013.01); *H03L 1/028* (2013.01); *H03L 1/04* (2013.01)

(58) Field of Classification Search
CPC ... H03B 5/04; H03B 5/30; H03B 5/32; H03H 3/0076; H03H 3/0077; H03H 9/02102; H03H 9/02244; H03H 9/02448; H03H 9/08; H03H 9/2405; H03H 2009/241; H03L 1/02; H03L 1/022; H03L 1/026; H03L 1/027; H03L 1/028; H03L 1/04
USPC .................................. 331/69, 70, 154, 176
See application file for complete search history.

(56) References Cited

U.S. PATENT DOCUMENTS

| 5,659,270 A * | 8/1997 | Millen .................... H03L 1/028 310/315 |
| 6,981,381 B1 | 1/2006 | Wang et al. |
| 9,705,470 B1 * | 7/2017 | Doll .................... H03H 9/02448 |
| 2002/0069701 A1 * | 6/2002 | Hsu ...................... H03H 3/0072 73/497 |
| 2005/0184822 A1 | 8/2005 | Mattila et al. |

(Continued)

*Primary Examiner* — Levi Gannon
(74) *Attorney, Agent, or Firm* — Arent Fox LLP

(57) ABSTRACT

A calibration system is provided for an oven controlled MEMS oscillator. The calibration system includes control circuitry that to separately selects predetermined target set-point values and controls a heater inside the oven controlled MEMS oscillator based on each of the selected target set-point values to adjust a set-point of the oven controlled MEMS oscillator. The system further includes an oscillation measurement circuit that measures respective oscillation frequencies at each adjusted set-point corresponding to each of the selected predetermined target set-point values. The measured oscillation frequencies can then be used to determine a target set-point operation value for the oven controlled MEMS oscillator, which can be sued to calibrate the oven controlled MEMS oscillator.

23 Claims, 13 Drawing Sheets

(56) References Cited

U.S. PATENT DOCUMENTS

| | | | |
|---|---|---|---|
| 2005/0195050 A1* | 9/2005 | Lutz | H03H 9/02338 333/186 |
| 2006/0012446 A1 | 1/2006 | Hardy et al. | |
| 2007/0290763 A1* | 12/2007 | Partridge | G01K 7/32 331/154 |
| 2008/0218279 A1 | 9/2008 | Keating | |
| 2009/0146746 A1* | 6/2009 | Unkrich | H03L 1/022 331/70 |
| 2011/0096510 A1 | 4/2011 | Stolpman et al. | |
| 2012/0305542 A1 | 12/2012 | Donnay et al. | |
| 2013/0008883 A1* | 1/2013 | Arai | H03L 1/022 219/210 |

* cited by examiner

OVEN CONTROLLED MEMS OSCILLATOR AND SYSTEM AND METHOD FOR CALIBRATING THE SAME

FIELD OF THE INVENTION

The present invention relates to a MEMS oscillator, and, more particularly, to an oven controlled MEMS oscillator with good temperature stability in a small size.

BACKGROUND OF THE INVENTION

Quartz crystals are widely used to provide reference frequencies in electronic oscillators. The frequency at which a quartz crystal resonator vibrates depends on its physical dimensions. Moreover, changes in temperature causes the quartz crystal to expand or contract due to thermal expansion and changes in the elastic modulus of quartz. The physical changes in turn change the crystal oscillation frequency. Although quartz has a very low temperature coefficient of frequency, temperature changes are still the major cause of frequency variation in crystal oscillators.

Oven controlled crystal oscillators ("OCXO") are frequency reference devices where the quartz oscillator is placed inside a temperature controlled oven. The oven is provided to maintain the oscillator at a constant temperature in order to prevent changes in the frequency due to variations in ambient temperature. This type of oscillator achieves the highest frequency stability possible with a quartz crystal. OCXOs are typically used to control the frequency of radio transmitters, cellular base stations, military communications equipment, and devices for precision frequency measurements, for example.

For OCXOs, the oven is a thermally-insulating enclosure that contains the crystal and one or more electrical heating elements. Since other electronic components in the oscillator circuit are also vulnerable to temperature drift, usually the entire oscillator circuit is enclosed in the oven. For these devices, a temperature sensor, such as thermistor, will be provided to monitor the oven temperature and a closed-loop control circuit will be provided to control the power to the heater to maintain the oven at the precise target temperature. Since the oven operates above ambient temperature, the oscillator usually requires a warm-up period of several minutes after the power has been applied. Moreover, the frequency of the device will not have the full rated stability during this warm-up period.

Although existing OCXOs generally provide good stability (e.g., typically better than 100 parts per billion ("ppb") over a specified temperature range), these devices also have several shortcomings. First, a typical quartz crystal is fairly large, which, turn, makes the final OCXO devices quite large. Since the manufacturing cost of the timing device is proportional to the size, the larger OCXO size is not preferred. Second, the long thermal time constant for heating and cooling leads to a very long start-up time. For example, it typically takes several minutes to stabilize the oven at the target temperature. Third, the power needed to maintain the oven temperature is fairly large. For example, a typical OCXO consumes over 1 watt to heat the oven. Finally, due to temperature gradients in the oven, the crystal temperature is not constant but may change by +/−1 K over an ambient temperature range of −40 to 85 C.

In general, microelectromechanical system ("MEMS") resonators are small electromechanical structures that vibrate at high frequencies and are often used as an alternative to quartz crystals. Accordingly, oven controlled MEMS oscillators that may provide very small timing devices with fast start-up times could offer significant benefits in many applications. Unfortunately, MEMS processes are not sufficient for realizing high accuracy clock without extensive physical trimming.

The accuracy challenge of such oven controlled MEMS oscillator devices is illustrated in FIG. 1, for example. In general, a typical MEMS resonator intended for oven controlled MEMS oscillator applications has a parabolic temperature dependency with a nominal turnover temperature $T_{turn}$=85° C. This means that when the device is placed in an oven heated to temperature of 85° C., small oven temperature fluctuations around this turnover temperature will only a small effect on the oscillation frequency. For example, a typical parabolic temperature dependency for MEMS resonator is −40 ppb/K². Thus, if the oven temperature varies by +/−0.5K around the turnover temperature $T_{turn}$, 85° C., the corresponding oscillation frequency variation is just 10 ppb which is acceptable for most applications.

However, due to manufacturing variations of MEMS resonators, the turnover temperature may vary by +/−5K as shown in FIG. 1, which increases the oscillator frequency variation. For example, as shown, if the turnover temperature is 90° C. and the oven temperature is 85° C., oven temperature fluctuations of +/−0.5K may lead to +/−200 ppb frequency fluctuations. This variation in oscillation is too significant for high accuracy clock applications.

SUMMARY OF THE INVENTION

The present disclosure overcomes the technical disadvantages of existing OCXO devices, as discussed above, by providing an oven controlled MEMS timing device that includes a very small oscillator that can be heated very rapidly with very low power. Moreover, a calibrating system is provided to calibrate the oven controlled MEMS timing device to correct component variations that may result on a device by device basis during manufacture.

Thus, according to an exemplary aspect, a calibration system is provided for an oven controlled MEMS oscillator. In the exemplary aspect, the calibration system includes control circuitry including at least one processor configured to separately select each of a plurality of predetermined target set-point values and to control a heater of the oven controlled MEMS oscillator to adjust a set-point of the oven controlled MEMS oscillator based on each of the selected predetermined target set-point values; and an oscillation measurement circuit configured to measure respective oscillation frequencies of the oven controlled MEMS oscillators at each adjusted set-point corresponding to each of the selected predetermined target set-point values. Moreover, the control circuitry is configured to determine a target set-point operation value based on the measured oscillation frequencies and to calibrate the oven controlled MEMS oscillator based on the determined target set-point operation value.

In a refinement of the exemplary aspect, the calibration system can include an electronic memory configured to store the plurality of predetermined set-point target values.

In another refinement of the exemplary aspect, the calibration system can include a heat control circuit configured to control the heater based on a difference between each of the selected predetermined target set-point values and a temperature measurement signal output by a temperature sensor inside the oven controlled MEMS oscillator.

Furthermore, the temperature sensor can be a thermistor and the temperature measurement signal is a temperature voltage measured across the thermistor. In one aspect, the heat control circuit is a differential amplifier configured to output a difference between the temperature measurement signal and the respective selected predetermined target set-point value. In another aspect, the heat control circuit is a proportional-integral-derivative (PID) controller configured to control the heater based on the difference between each of the selected predetermined target set-point values and the temperature measurement signal.

Furthermore, the calibration system can include a control loop for controlling the heater to minimize a difference between the temperature measurement signal and the respective selected predetermined target set-point value to drive a heater current applied to the heater.

In one exemplary aspect, the control circuitry is provided to determine the target set-point operation value by generating a curve of the measured oscillation frequencies versus and the corresponding selected predetermined target set-point values, and perform a polynomial fit of the generated curve to identify the target set-point operation value as the set-point value equaling zero in the polynomial fit.

In another aspect, the control circuitry is configured to calibrate the oven controlled MEMS oscillator by storing the determined target set-point operation value in non-volatile memory of the oven controlled MEMS oscillator, such that the heater of the oven controlled MEMS oscillator is controlled to heat the oven controlled MEMS oscillator during operation based on the determined target set-point operation value.

The oven controlled MEMS oscillator can include, for example, a frame, a platform disposed with the frame, a resonator coupled to the platform, and a temperature sensor disposed on the platform and configured to output a temperature measurement signal to control the heater with each of the selected predetermined target set-point values. Moreover, the heater can be disposed on the platform and is configured to heat the platform to adjust the set-point of the oven controlled MEMS oscillator. In a refinement of this aspect, the resonator is bulk acoustic mode resonator.

In yet another exemplary aspect, an oven controlled MEMS oscillator device is provided that includes a silicon platform; a resonator coupled to the silicon platform; a temperature sensor coupled to the silicon platform and configured to output a temperature measurement signal during operation of the oven controlled MEMS oscillator device; a heater coupled to the platform and configured to heat the oven controlled MEMS oscillator device based on a heat control signal; and non-volatile electronic memory configured to store a target set-point. The oven controlled MEMS oscillator device further includes a heat control circuit configured to generate the heat control signal based on a difference between the stored target set-point value and the temperature measurement signal output from the temperature sensor. Moreover, the heat control circuit is configured minimize the heat control signal by adjusting the heater to minimize the difference between the stored target set-point value and the temperature measurement signal.

In yet another exemplary aspect, a method is provided for calibrating an oven controlled MEMS oscillator. In the exemplary aspect, the method includes separately selecting each of a plurality of predetermined target set-point values; controlling a heater in the oven controlled MEMS oscillator to adjust a set-point of the oven controlled MEMS oscillator based on each of the selected predetermined target set-point values; measuring, by an oscillation measurement circuit, respective oscillation frequencies of the oven controlled MEMS oscillator at each adjusted set-point corresponding to each of the selected predetermined target set-point values; determining a target set-point operation value based on the measured oscillation frequencies; and calibrating the oven controlled MEMS oscillator based on the determined target set-point operation value.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EMBODIMENTS

Example aspects are described herein in the context of an oven controlled MEMS oscillator that overcomes many of the technical disadvantages of existing oscillator devices. In particular, the oven controlled MEMS oscillator disclosed herein is small-sized oscillator that can be heated very rapidly with very low power.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1:
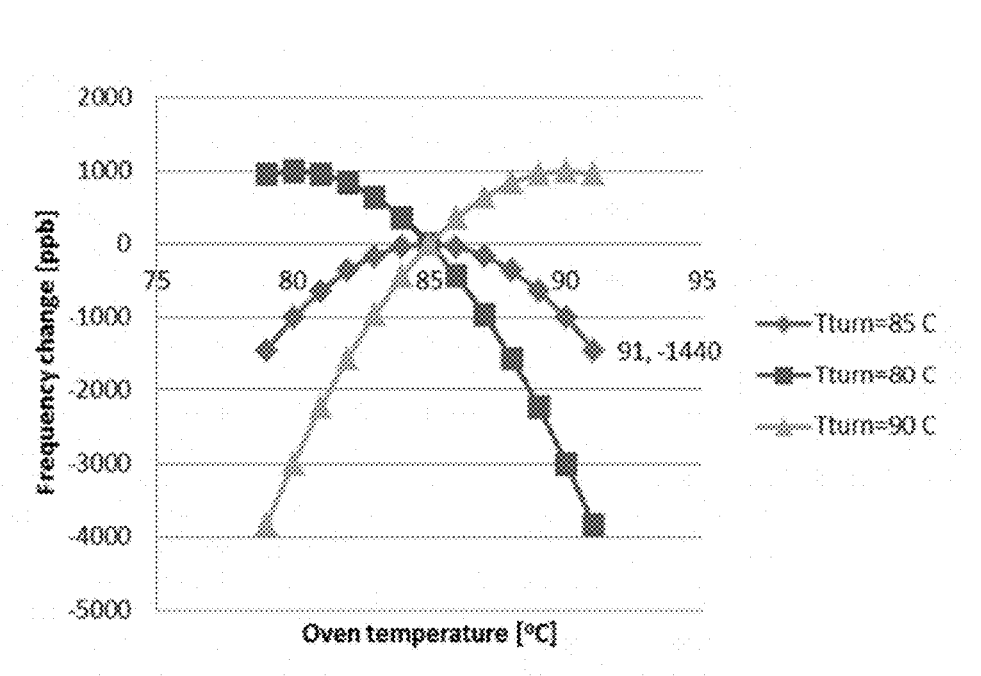
FIG. 1 provides a graph illustrating accuracy challenges of oven controlled MEMS oscillator devices due to manufacturing variations.
Figure 2A:
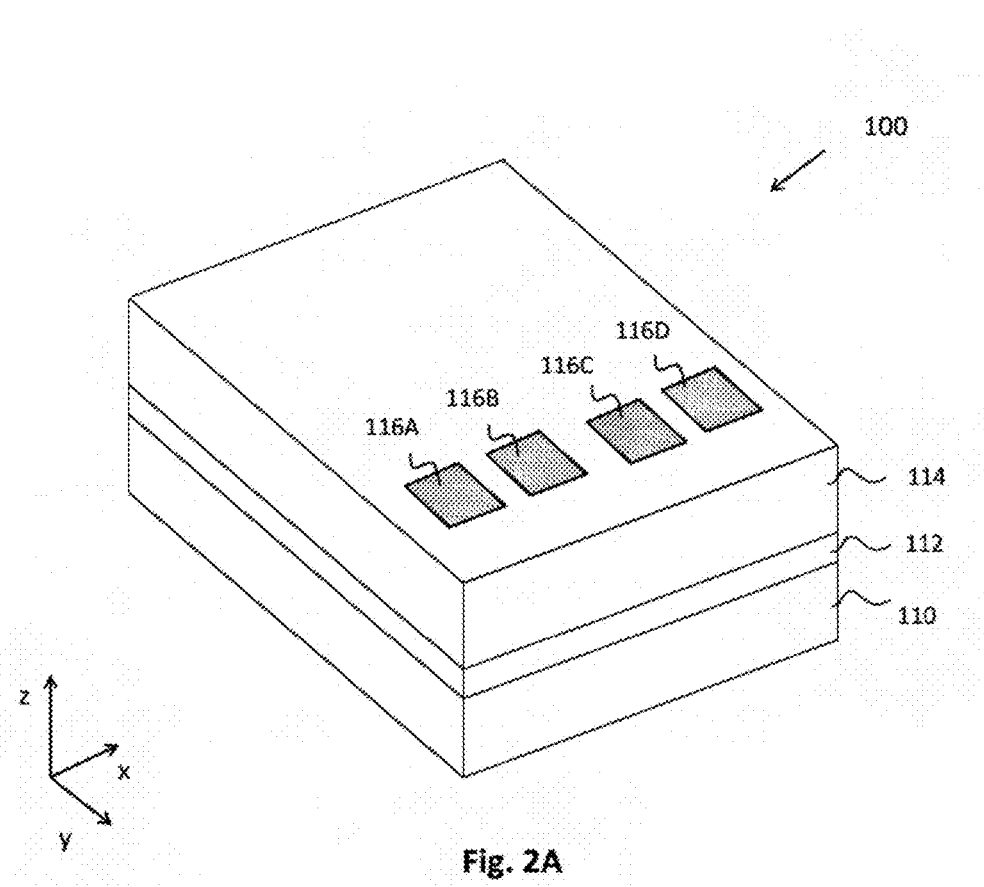
FIG. 2A illustrates an outer perspective view of an oven controlled MEMS resonator in accordance with an exemplary embodiment.

FIG. 2A illustrates an outer perspective view of an oven controlled MEMS resonator in accordance with an exemplary embodiment. As shown, the MEMS resonator device 100 includes a frame 112 and a resonator cap 114 that are provided upon a substrate 110. As will be discussed below and shown in FIG. 3, for example, substrate 110 includes a concave cavity C in a central area thereof, such that a resonator inside the MEMS resonator device 100 is capable of vibrating above the cavity C.

Figure 6:
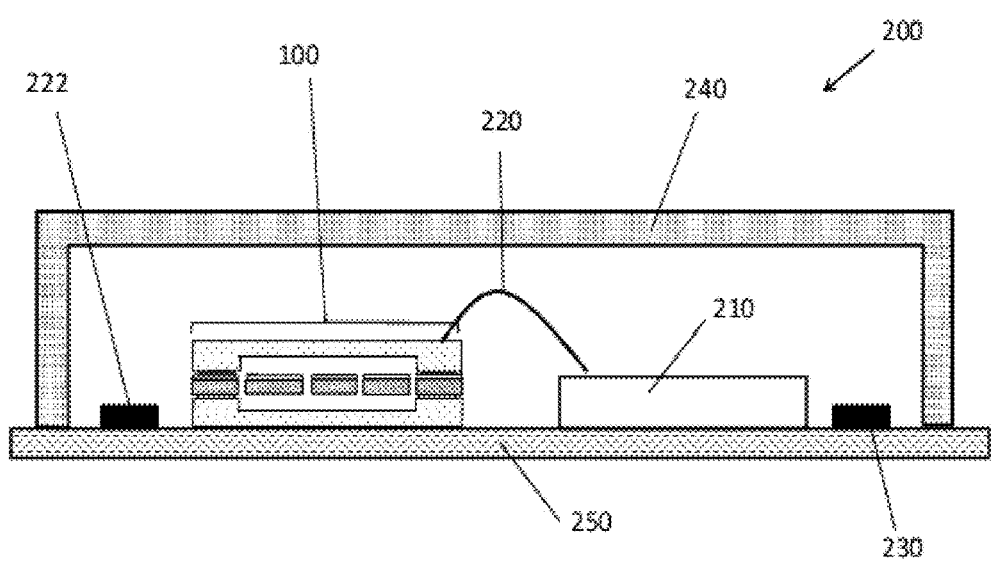
FIG. 6 illustrates a timing device including the MEMS resonator 100 in accordance with an exemplary embodiment.

Preferably, the MEMS resonator device 100 of the exemplary embodiment is manufactured with MEMS manufacturing techniques, for example, as described in "Fundamentals of Microfabrication and Nanotechnology, Volume II: Manufacturing Techniques for Microfabrication and Nanotechnology", by Marc J. Madou, CRC Press, 2011. Thus, according to the exemplary embodiment, the MEMS resonator device 100 is a chip scale packaged ("CSP") MEMS resonator. Preferably, the MEMS resonator device 100 is fabricated of cavity silicon-on-insulator ("SOI") wafers with the substrate 110 made of silicon, the frame 112 made of SOI silicon, and the resonator cap 114 visible to outside. As further shown, a plurality of electrical contact pads (e.g., contact pads 116A though 116D) are provided on top of the resonator cap 114 for connecting the resonator to oscillation circuitry, as would be understood to one skilled in the art, an example of which is shown in FIG. 6 and discussed below.

Figure 2B:
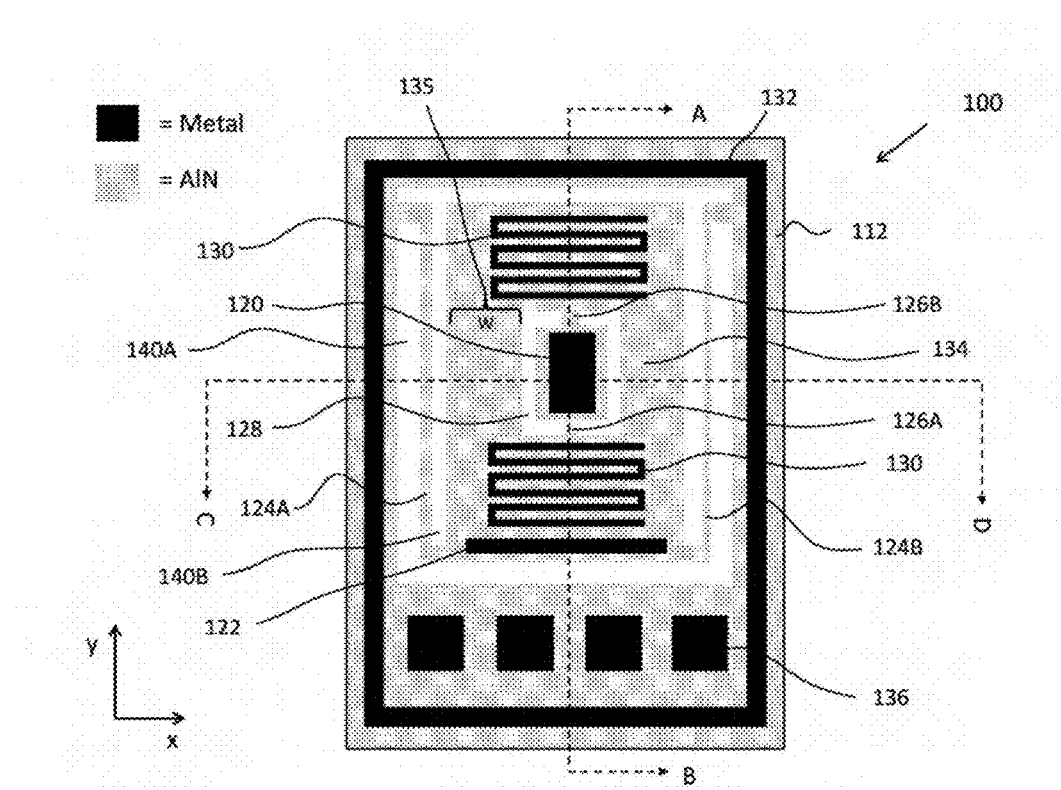
FIG. 2B illustrates a cross sectional view of the MEMS resonator of FIG. 2A in accordance with an exemplary embodiment.
Figure 2C:
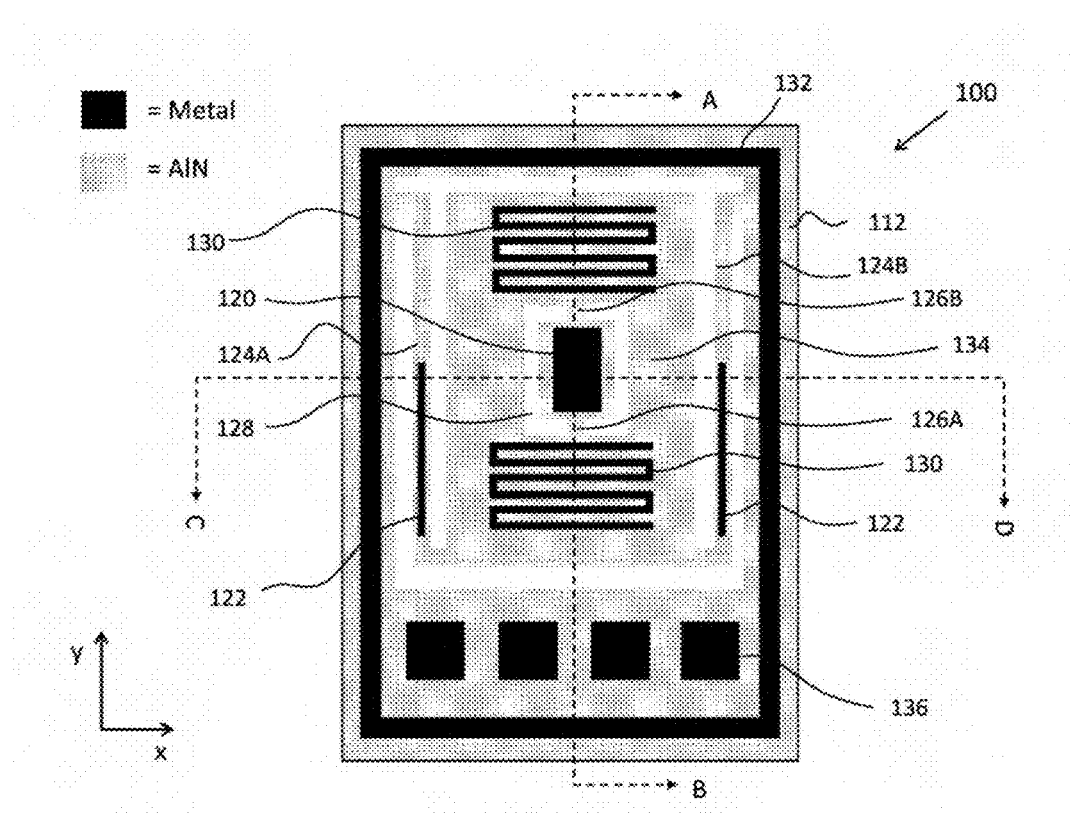
FIG. 2C illustrates a cross sectional view of the MEMS resonator of FIG. 2A in accordance with another exemplary embodiment.

FIG. 2B illustrates a cross sectional view of the MEMS resonator 100 of FIG. 2A in accordance with an exemplary embodiment. Moreover, FIG. 2C illustrates a cross sectional view of the MEMS resonator of FIG. 2A in accordance with another exemplary embodiment, the details of which will be discussed below. The views shown in FIGS. 2B and 2C are cross section views of the MEMS resonator device 100 taken along the cross section of the frame 112 without the resonator cap 114 attached thereto.

As shown in FIG. 2B, the MEMS resonator device 100 includes a resonator 120 disposed on a rectangular plate and secured to a heated platform 134 by two thin anchor beams 126A and 126B that are coupled to opposing first sides of the resonator 120. According to an exemplary embodiment, the resonator 120 is preferably a bulk acoustic mode resonator that vibrates in-plane mode (i.e., the motion is mostly in x/y plane) as these types of modes provide higher quality factor and power handling capacity. For example, according to this aspect, the vibration modes are preferably the width extensional mode and the Lame-mode. Moreover, according to the exemplary embodiment, the thin anchor beams 126A and 126B minimize the vibrational energy loss from the resonator 120 to the heated platform 134.

Due to vibration coupling between the resonator 120 and the platform 134 through the anchor beams 126A and 126B, there is a risk of unwanted resonances that combine the vibrations of the resonator 120 and platform 134. To minimize these unwanted spurious resonances, the platform 134 should be mechanically rigid. Moreover, according to an exemplary embodiment, the unwanted spurious resonances can be minimized when the platform 134 completely surrounds the resonator 120 and the width 135 of the platform 134 (i.e., between an outer edge of the platform 134 and cavity 128) surrounding the resonator 120 is at least 2× the thickness of the platform 134 and preferably at least 4× the thickness of the resonator 120.

As further shown, the heated platform 134 includes heater 122 to provide the oven effect to heat the platform 134 and a temperature sensor, i.e., a thermistor 130, provided to measure the temperature of the heated platform 134. Moreover, the platform 134 is supported by support beams 124A and 124B that connect the heated platform 134 to the package frame 112. The support beams 124A and 124B are connected to the platform 134 substantially on one end. This arrangement is beneficial as it ensures a most uniform heat distribution over the platform 134 since the heat flow out of the platform 134 on from this end. As shown, the support beams 124A and 124B extend vertically (i.e., in the y direction) with cavities (e.g., 140A and 140B along beam 124A) also extending on both sides of each support beam 124A and 124B. As a result, the heated platform 134 is thermally isolated from the frame 112. The symmetric structure of the pair of support beams 124A and 124B provides good support against mechanical shocks. Moreover, the long length of the support beams 124A and 124B where the beam extends over the length of the platform 134 ensures good thermal isolation of the platform 134.

As shown in FIG. 2B, each of the pair of support beams 124A and 124B includes a short first portion that extends in a widthwise direction of the oscillator (i.e., in the x direction), a second long portion that extends in a lengthwise direction of the oscillator (i.e., in the y direction) and in parallel to sides of the platform, and a third portion that again extends in the widthwise direction of the oscillator (i.e., in the x direction) and that is coupled to the respective sides of the one end of the platform. It should be appreciated that alternative structural configurations can be provided for the support beams 124A and 124B (for example a single support beam can be used to affix the platform 134 to the frame 112) and/or that additional support beams can be provided according to alternative embodiments.

Moreover, according to an exemplary embodiment, the heater 122 is positioned near the support beams 124A and 124B (e.g., between or adjacent to where the support beams 124A and 124B are attached to the platform 134). As shown, the support beams 124A and 124B are attached to sides of a first end of the heated platform 134. The heater 122 extends between the sides of the heated platform 134 where the support beams 124A and 124B are attached with the thermistor disposed between the heater 122 and the resonator 120. In preferred embodiment, the thermistor 130 is disposed on two sides of the resonator 120 (i.e., between the resonator 124 and heater 122 and between the resonator 120 and side of the platform 134 opposing the thermistor 130). This ensures that if there is any thermal gradient in the platform, the thermistor will read the average temperature in the platform.

According to this configuration, when the heater 122 is on, the heat power generated by the heater 122 raises the temperature of the platform 134 and heat flows through the beams 124A and 124B. In steady state, the heat power and heat flow balances and substantially all heat power flows through the support beams 124A and 124B. Due to the heat flow, there is a large temperature gradient across support beams 124A and 124B; however, as the heat flow is from the heater 122 to the support beams 124A and 124B, the remaining portion of the platform 134 is at uniform temperature. If the heater 122 was located on the opposite side of the platform compared to the connection points of the support beams 124A and 124B, there would be a constant heat flow across the platform 134 from heater 122 to the support beams 124A and 124B resulting in large temperature gradients and poor temperature control. In other words, in preferred embodiment, the heater 122 should be located in the area defined by the connections of the support beams 124A and 124B on one side and the resonator 120 and temperature sensor 130 positioned on other side of the platform 134.

According to an alternative embodiment, the heater 122 includes a pair of heating elements that can be positioned on the support beams 124A and 124B themselves, as shown in FIG. 2B, for example. FIG. 2C illustrates an alternative embodiment to FIG. 2B, but otherwise has the some components except for the positioning of the heater 122 on the support beams 124A and 124B. Thus, the identical components of FIG. 2C will not be separately described herein.

By positioning the heater 122 between the support beams 124A and 124B (i.e., FIG. 2B) or on the support beams 124A and 124B (i.e., FIG. 2C), these configuration result in a uniform or a substantially uniform platform temperature profile. Moreover, the thermistor(s) 130 should be located close to the resonator 120 to ensure that the temperature of the resonator 120 can be accurately measured. As shown in FIGS. 2B and 2C, the thermistor 130 is disposed on the heated platform 134 adjacent to both anchoring beams 126A and 126B. As further shown, there is a cavity 128 that surrounds the rectangular plate holding the resonator 120, including on two second opposing sides of the resonator 120, except where the resonator 120 is anchored to the heated platform 134 by anchoring beams 126A and 126B. The anchoring beams 126A and 126B connect to the resonator 120 near the resonator nodal point (e.g., a centerline of the resonator during vibration) to minimize the energy leakage from resonator 120 to the platform 134 and allow optimization of the resonator 120 and heated platform 134 separately. In the exemplary embodiment, the resonator 120 is a width extensional bulk acoustic mode resonator and the two anchoring beams 126A and 126B attach to the nodal points at two short sides of the rectangular resonator 120. If other resonators are used, the number of anchor beams may be different in such embodiments. For example for Lamemode resonators, four anchor beams may be used to anchor to the beam corners. In either configuration, the resonator 120 is capable of vibrating in the cavity 128 during operation of the MEMS resonator device 100. Moreover, the heated platform 134 is rectangular shaped and surrounds the resonator.

Moreover, as noted above with respect to FIG. 2A, the resonator cap 114 includes a plurality of electrical contact pads 116A though 116D. As shown in FIG. 2C, the MEMS resonator device 100 includes a plurality of electrical via contacts 136 (only one via contact is marked with reference numeral 136) that are electrically coupled to the electrical contact pads 116A though 116D in the cap 114. Furthermore, the frame 112 includes a metal bonding ring 132 that facilitates bonding of the frame 112 to the resonator cap 114 during manufacture of the device 100, as would be understood to one skilled in the art.

Furthermore, according to an exemplary embodiment and as will be discussed in more detail below, the thermistor 130, heater 122, and electrode layer(s) of the resonator 120, can be formed by depositing the same metal (e.g., molybdenum) during manufacturing. Using the same materials for these components helps reduce manufacturing steps and minimize manufacturing costs, as would be appreciated to one skilled in the art.

Figure 3:
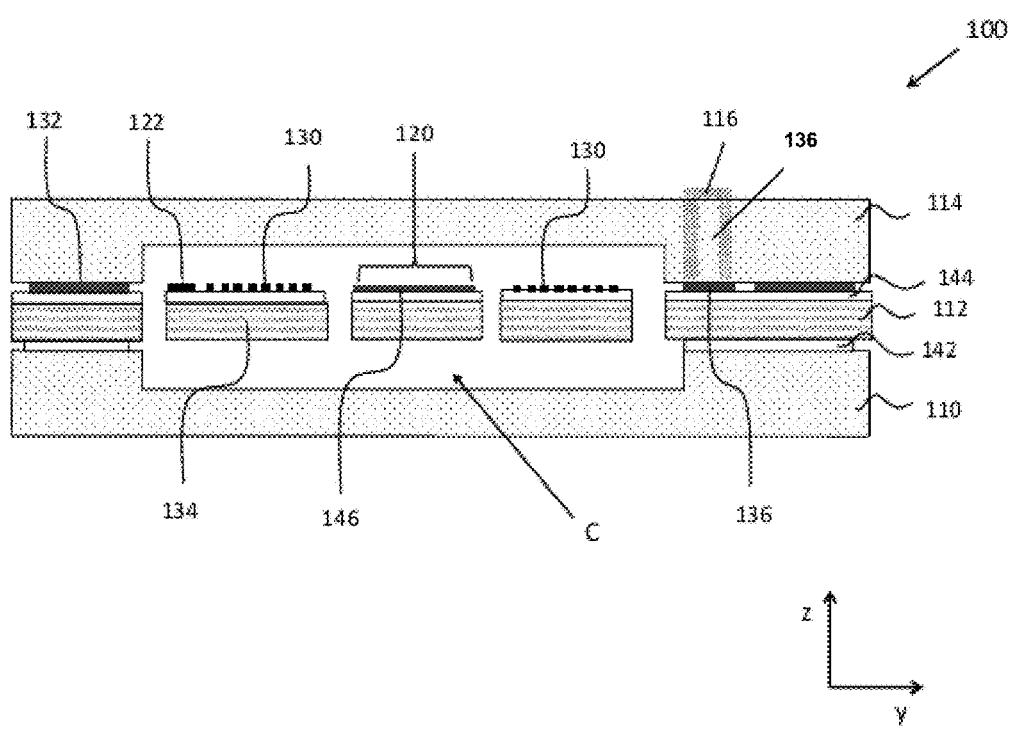
FIG. 3 is a cross-sectional side view of the oven controlled MEMS resonator taken along an A-B line indicated in FIGS. 2B and 2C.

FIG. 3 is a cross-sectional side view of the oven controlled MEMS resonator 100 taken along an A-B line indicated in FIGS. 2B and 2C. According to the exemplary embodiment, the resonator 120 and the heated platform 134 are etched of the same SOI silicon that is used from the frame 112. Moreover, there are several thin film layers deposited on top of the SOI silicon.

Specifically, a piezoelectric layer 144, preferably formed from AlN is formed on top of the SOI silicon layer, with a lower excitation electrode and an upper excitation electrode disposed on the top and bottom surfaces, respectively, of the piezoelectric layer 144. The electrodes (only the upper electrode is shown as reference number 146) are preferably formed from molybdenum and together with the AlN layer 144 are used for piezoelectric actuation of the resonator 120. As noted above, the same metal can also be used to form the heater 122 and thermistor 130. It should be appreciated that alternative/additional thin film layers may also be used for resonator 120 according to alternative embodiments.

As the support arms 124A and 124B, the heated platform 134, the anchoring beams 126A and 126B, and the resonator 120 are all etched of the same silicon layer, manufacturing is simplified, but the inclusion of the anchor beams 126A and 126B still allows a separate optimization of resonator 120 and support platform 134.

According to additional embodiments, the MEMS resonator device 100 may include multiple metal layers that can be used for signal routing and to reduce the resistive signal losses. Moreover, in one embodiment, silicon dioxide layers 142 may incorporated below and/or above the SOI silicon used for the frame 112 to provide for thermal compensation of the resonator 120. Preferably, the SOI silicon (i.e., the frame 112) is bonded to the substrate 110 with the silicon dioxide insulating layer 142. Moreover, it is preferable that the substrate 110 has a cavity C so the heated platform 134 and resonator 120 do not easily contact the substrate 110, for example, if the resonator device 100 experiences a mechanical shock. Moreover, according to an exemplary embodiment, the resonator cap 114 is bonded with a metal eutectic bond by the metal bonding ring 132. Metal bonds are also used for making a contact to the electrical vias 140 in the resonator cap 114.

As can readily be seen in FIG. 3, the resonator 120 is disposed in a cavity C defined by the substrate 110 and the resonator cap 114. Accordingly, when the heater 122 heats the platform 134, the heated platform 134 is preferably heated to a first temperature that stabilizes the temperature of the "oven" defined by cavity C, and effectively, heats the resonator 120. The thermistor 130 is disposed in the same plane as the heater 122 (i.e., in the x,y plane) and is also preferably disposed on both sides of the resonator 120 to ensure an accurate temperature measurement of the temperature of the resonator 120. As a result, the thermistor 130 is configured to provide feedback control to the heater 122 as part of a closed-loop control system to actively regulate the temperature of the resonator 120, as will be understood by those skilled in the art. Any suitable known feedback control system for active temperature control may be employed. For example, according to one embodiment, the thermal control loop electronics are located off the resonator 100 chip on a printed circuit board that includes circuitry coupled to the heater 122 and thermistor 130. Here, the details of such circuitry are not described in detail so as to not unnecessarily obscure the aspects of the invention.

Figure 4:
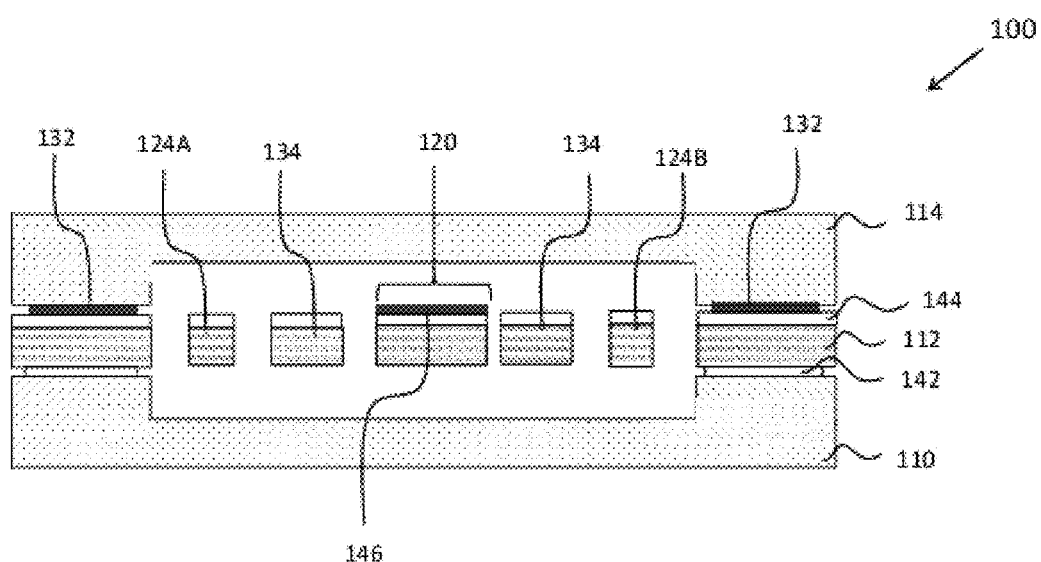
FIG. 4 is a cross-sectional side view of the oven controlled micromechanical resonator taken along an C-D line indicated in FIGS. 2B and 2C.

FIG. 4 is a cross-sectional side view of the oven controlled MEMS resonator 100 taken along an C-D line indicated in FIGS. 2B and 2C. Preferably, the thickness of the SOI silicon for the frame layer 112 is between 5 μm and 30 μm. Moreover, the piezoelectric layer 144 preferably has a thickness between 0.5 μm and 2 μm and the metal electrodes (e.g., metal electrode 146) has a thickness that is typically 1 μm or less. Moreover, if other thin film layers are used, such as silicon dioxide layer 142, they also have a thickness that is typically 1 μm or less.

According to an exemplary embodiment, the lateral dimensions of the resonator are 300 μm by 600 μm. Moreover, as shown in FIGS. 2B and 2C, the heated platform 134 is rectangular shaped and is large enough to support the resonator 120 and the thermistor 130. The thermistor 130 preferably comprises a serpentine shape in order to maximize the resistance per unit area. According to the exemplary embodiment, the total area of the thermistor 130 may be 400 μm by 400 μm and the thickness of the thermistor 130 may be 0.2 μm, for example.

The heater 122 may be small in comparison to the thermistor 130 and should be placed near or on the support beams 124A and 124B, as discussed above and shown in FIGS. 2A and 2B. In the exemplary embodiment, the support beam 124A and 124B have a width of 10 μm and length 400 μm, for example, to be thermally isolating, but still rigid enough for mechanical support of the heated platform 134. The anchor beams 126A and 126B preferably have a width that is typically less than 5 μm in order to minimize the vibrational energy leakage and to maximize the mechanical resonator quality factor.

The oven controlled MEMS resonator 100 disclosed herein provides many technical advantages when compared with conventional systems, such as the OCXO devices described above. For example, because the heated platform 134 has a small thermal mass, i.e., it requires minimal heat energy to reach a desired temperature, the time constant for heating and cooling the heated platform 134, and, effectively, the resonator 120, is small. In particular, the resonator 120 can be heated to the target temperature in 100 ms or less according to the exemplary embodiment. In addition, the heated platform 134 is thermally isolated, as shown above in FIGS. 2A and 2B, since the platform 134 is coupled to frame 112 only by support beams 124A and 124B that are connected at one end of the heated platform 134. As a result, the pressure inside the package can be reduced to improve the quality factor of the resonator 120 and eliminate thermal convection through air. For example, a typical package pressure may be 100 Pa or less. The main heat loss mechanism is the heat flow through support beams which can be long to provide large thermal resistance. For example, two silicon support beams with thickness of 10 μm, width 10 μm, length 400 μm will have thermal resistance of 15 K/mW. This means that just 5 mW is sufficient to heat the resonator by 75 degrees, which is a significantly smaller amount of required heating power than needed in conventional 0=devices (e.g., 1 W), as discussed above.

Figure 5:
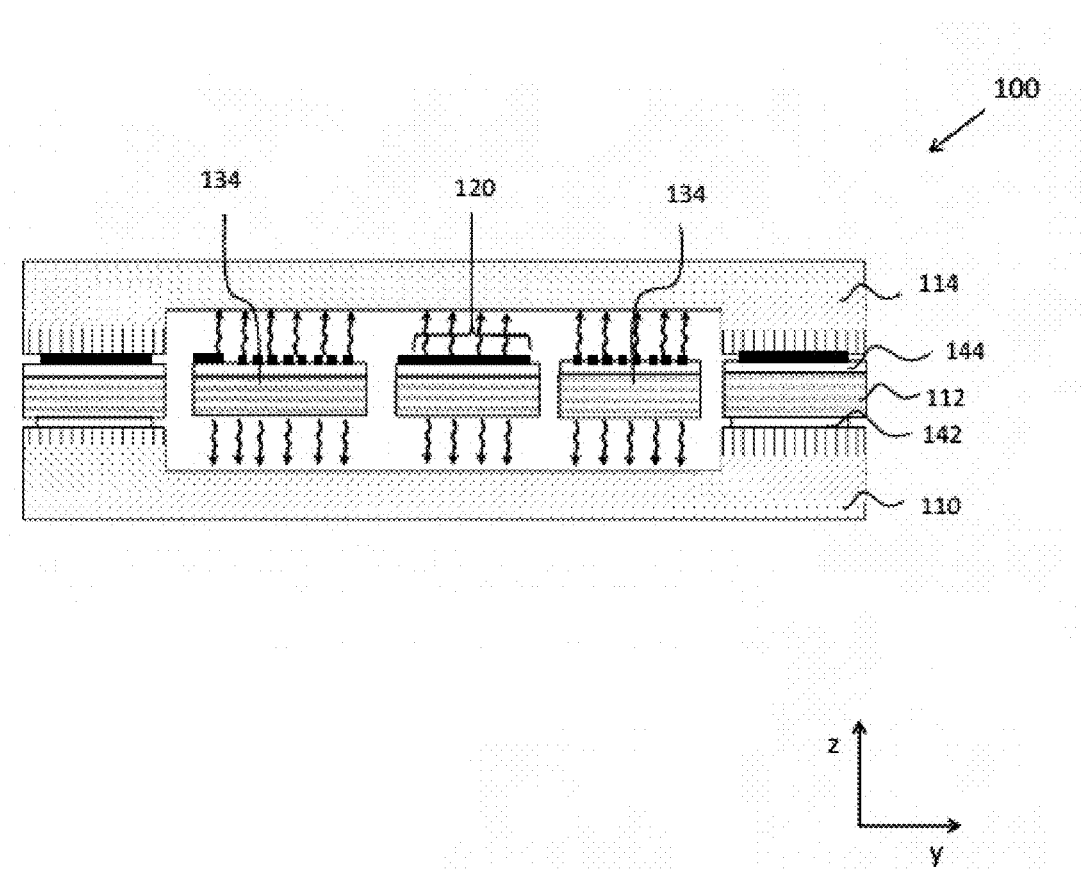
FIG. 5 is another cross-sectional side view of the oven controlled MEMS resonator taken along an A-B line indicated in FIGS. 2B and 2C.

Although the thermal convection loss is eliminated with low pressure packaging, the heated platform 134 and the resonator 120 also lose heat via radiation as is illustrated in FIG. 5. In particular, FIG. 5 is another cross-sectional side view of the oven controlled MEMS resonator 100 taken along an A-B line indicated in FIGS. 2B and 2C.

As shown in FIG. 5, heat dissipation is illustrate by arrows extending from the heated platform 134 and the resonator 120. According to an exemplary embodiment, the platform 134 is heated to temperature T1, but the package temperature T2 can be lower. The temperature differential will result in radiation losses. In general, radiation loss is detrimental in maintaining a constant temperature for the resonator 120 since radiation loss results in temperature gradients in the heated platform 134 and, therefore, the resonator 120. As a result, the temperature of the thermistor 130 may differ from the temperature of the resonator 120, resulting in incorrect temperature reading. If the temperature is measured incorrectly, the temperature of the resonator 120 will differ from the target temperature causing a frequency change.

In the present embodiment, the thermistor 130 is formed as part of the heated platform 134 (as shown above) and the thermal coupling to the resonator 120 is very good. Thus, even with the radiation losses as shown in FIG. 5, the temperature error will be less than 1 K, and typically 0.1 K.

FIG. 6 illustrates a timing device 200 including the MEMS resonator 100 in accordance with an exemplary embodiment. Preferably, the timing device 200 shown in FIG. 6 can be used in applications for wireless base stations, GPS receivers, and other systems requiring accurate time or frequency reference, for example.

As shown for this embodiment, the exemplary resonator device 100, described above, can be placed inside another oven to further reduce the radiation induced temperature errors and stabilize the oscillation frequency. Specifically, the timing device 200 includes the resonator 100 disposed on a carrier 250. The carrier 250 may be a ceramic substrate or printed circuit board (PCB), for example. Moreover, an outer oven lid 240 is secured to the carrier 250 to house the resonator 100 and the associated oscillation circuitry 210 that is connected to the resonator 100 by a wire bond 220. The lid 240 may be a metal lid, for example. A second heater 222 is provided on the carrier 250 to heat the outer oven and a second thermistor 230 is also provided on the carrier 250 to measure the outer temperature to ensure that the heater 222 is adjusted to maintain the target temperature.

In this embodiment, the outer oven temperature T2 can be the same or slightly lower than the temperature T1 inside the resonator 100 (i.e., the temperature of resonator 120 discussed above). For example, the MEMS platform in the resonator 100 may have a nominal turnover temperature of 95° C., which would mean that the heater 122 for the resonator 120 is configured to nominally heat the MEMS platform to 95° C. Moreover, the outer ovenized package can be heated to a lower temperature by the second heater 222 to be 85° C., for example. As a result, the radiation loss is small and constant over the ambient temperature variations. Advantageously, the timing device 200 is configured to stabilize the oscillation circuitry 210 at a constant temperature that is the same or less than the circuit inside resonator 100.

However, even with such configurations, the actual turnover temperature will likely vary due to manufacturing variations in the MEMS process, i.e., the optimal turnover temperature will not necessarily be 95° C., requiring the device to be physically trimmed using conventional techniques. For example, the actual turnover temperature may range, for example, from 90° C. to 100° C. In addition, the resistance of the heater 122 and the output of the temperature sensor 130 on the MEMS platform 100 may vary from device to device also due to manufacturing variations.

Figure 7:
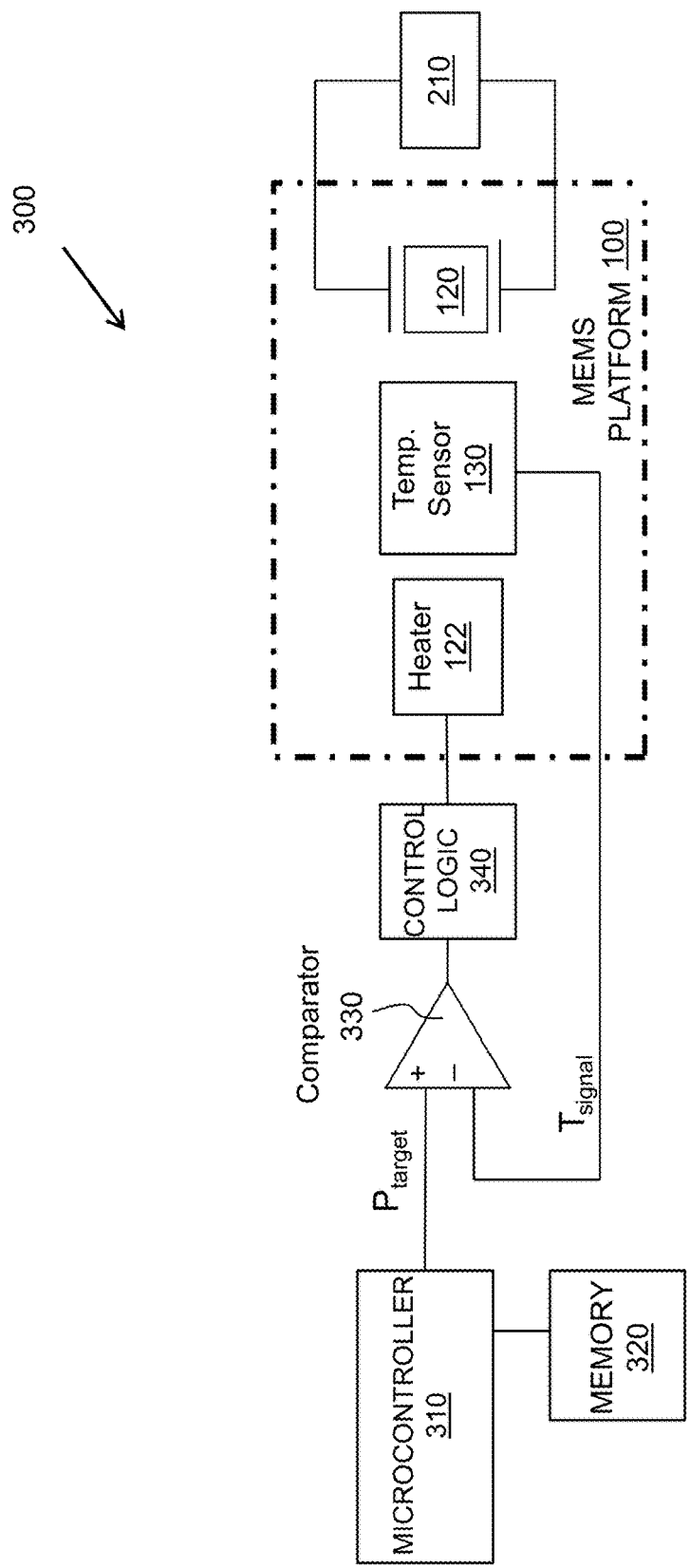
FIG. 7 illustrates an oven controlled MEMS resonator device in accordance with an exemplary embodiment.

FIG. 7 illustrates a block diagram of an oven controlled MEMS oscillator device 300 in accordance with an exemplary embodiment. As shown, the oven controlled MEMS oscillator device 300 is provided to be used with the exemplary resonator device 100 (i.e., the "MEMS platform"). Accordingly, the MEMS platform 100 includes resonator 120, heater 122, temperature sensor 130, as described above. The details of these exemplary components are described above and will not be repeated herein. In addition, the resonator 120 is coupled to oscillation circuitry 210 by a wire bond as also described above. In an exemplary aspect, the oscillation circuitry 210 may be, for example, a Pierce oscillator circuit configured to maintain the resonator vibrations as should be appreciated to one skilled in the art.

According to the exemplary aspect, the oven controlled MEMS oscillator device 300 is configured to correct variations in turnover temperature, heater resistance, and thermistor resistance that result from manufacturing variations on a device to device basis. Advantageously, OCMO device 300 is configured to correct these variations by an electronic calibration of the whole system of the oven controlled MEMS oscillator (rather than a calibration of only the resonator, for example), such that all errors are corrected with a single calibration procedure. The calibration system will be described below with respect to FIGS. 8 and 9, for example.

As further shown, the oven controlled MEMS oscillator device 300 includes control circuitry for controlling the set-point of the MEMS platform 100 according to the exemplary aspect. Specifically, the oven controlled MEMS oscillator device 300 includes a microcontroller 310, memory 320, differential amplifier 330 and control logic 340.

In this aspect, the microcontroller 310 can be a conventional microcontroller that includes one or more computer processing units (CPUs) along with memory and programmable input/output peripherals. The microcontroller 210 is configured to execute programmable instructions stored in memory in order to perform the calibration algorithms described herein.

In particular, the microcontroller 310 is configured to set a plurality of temperature set-points $P_{target}$ for the heated platform. As will be described below, the temperature set-points can be fed by external control circuitry during calibration. Moreover, an optimal set-point can be determined through the calibration and then stored in the memory 320 (i.e., any type of electronic non-volatile memory, for example) and is retrieved from the memory 320 when operation of the oven controlled MEMS oscillator device 300 is initiated.

As further described above, the temperature sensor 130 (e.g., a thermistor) is configured to generate and provide a temperature signal $T_{signal}$ that is a feedback signal used to monitor the temperature of the heated MEMS platform 100. As shown, the set-point $P_{target}$ is fed to a non-inverting input of differential amplifier 330 and the measured temperature signal $T_{signal}$ (i.e., a temperature measurement signal) is fed to an inverting input of heat control circuit that can comprise differential amplifier 330. As a result, the differential amplifier 330 is configured to generate a difference between the temperature set-point $P_{target}$ and temperature sensor signal $T_{signal}$. Moreover, according to the exemplary aspect, this voltage difference output from the differential amplifier 330 is used as a heat control signal to adjust the platform heater power in a closed control loop that minimizes the difference between set-point $P_{target}$ and temperature sensor signal $T_{signal}$. In other words, the heater voltage is proportional to the difference between the temperature set-point $P_{target}$ and temperature sensor signal $T_{signal}$ and this control is recognized as proportional controller. As will be described in more detail below, the closed loop control logic 340 (i.e., the heat control circuit) may also be a PID ("proportional-integral-derivative") controller, for example, according to an exemplary aspect.

In any event, the control logic 340 can generate a heat control signal based on the difference between set-point $P_{target}$ and temperature sensor signal $T_{signal}$ to drive the heater 122 in order to minimize the difference between the signals. In other words, the control logic 340 increases or decreases the heat generated by the heater 122 to drive the difference output from the differential amplifier 330 towards a zero value.

As described above, due to MEMS process variations during manufacturing, the actual set-point value for optimal operation is not known and will typically vary from device to device.

Figure 8:
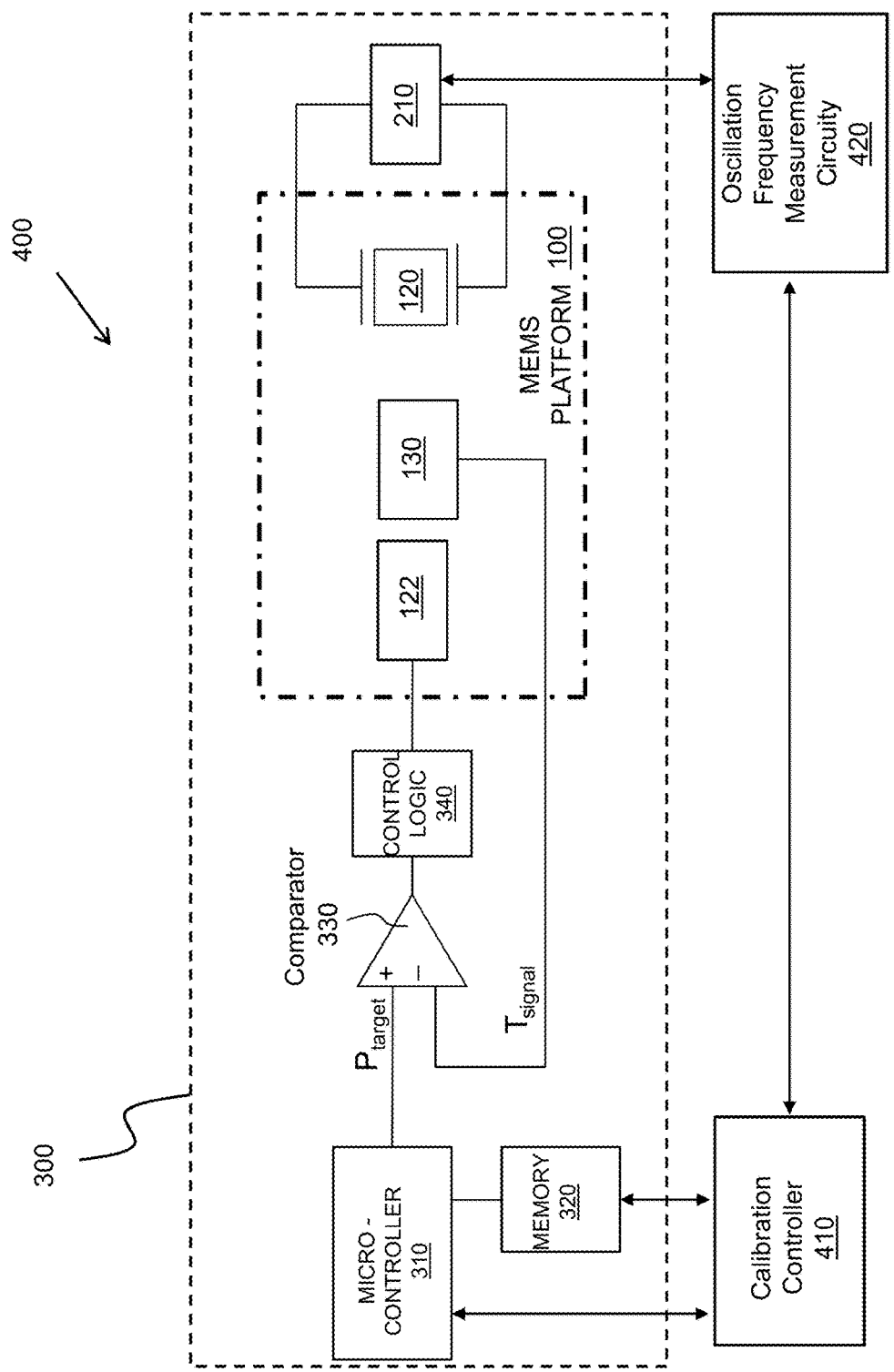
FIG. 8 illustrates a block diagram of a system for calibrating an oven controlled MEMS resonator in accordance with an exemplary embodiment.

FIG. 8 illustrates a block diagram of a system for calibrating an oven controlled MEMS resonator in accordance with an exemplary embodiment. As shown, in the exemplary embodiment, the oven controlled MEMS oscillator device 300 can be coupled to external calibration circuitry include a calibration controller 410 and oscillation frequency measurement circuitry 420. This external control circuitry of the calibrating system 400 is configured to provide a calibration of the oven controlled MEMS oscillator device 300 by selecting a predefined range of set-points that are used to test oscillation frequencies of the MEMS platform 100 during operation.

In particular, calibration controller 410 can be any type of computing device that includes a computer processor and electronic memory and is configured to perform the calibration algorithm described herein through software. Moreover, the calibration controller 410 is configured to be temporarily connected to the microcontroller 310 and memory 320 during the MEMS calibration procedure. That is, after the oven controlled MEMS oscillator device 300 has been manufactured, it will be temporarily connected to the calibration controller 410 that is configured to determine the optimal set point for the specific oven controlled MEMS oscillator device 300 and store this determined set-point in the non-volatile memory 320 of the oven controlled MEMS oscillator device 300.

As further shown, oscillation frequency measurement circuit 420 is coupled to the oscillation circuitry 210 of the MEMS platform 100. In this regard, at each specific set point (as controlled by calibration controller 410), the oscillation frequency measurement circuit 420 will measure the corresponding oscillation frequency of the MEMS platform and provide this information back to calibration controller 410 to be stored in a lookup table, for example, as will be explained below. The oscillation frequency measurement circuit 420 can be any type of conventional device (e.g., oscilloscope) configured to measure the oscillation frequency of the oven controlled MEMS oscillator device 300 during the calibration procedure.

Figure 9:
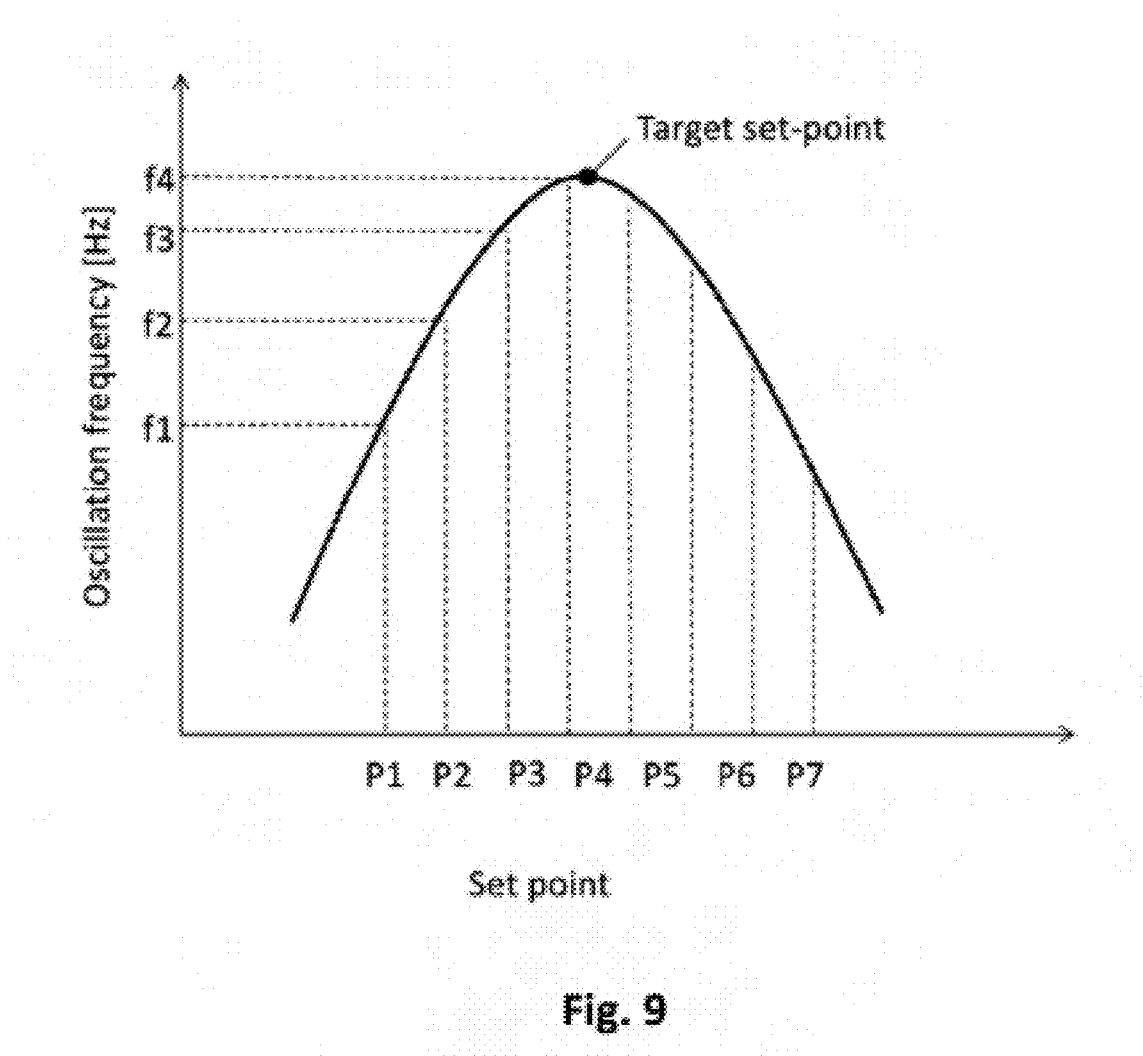
FIG. 9 illustrates a graph of the obtained oscillation frequency in Hz versus applied set-points for performing the calibration of the MEMS platform according to an exemplary aspect.

FIG. 9 illustrates a graph of the obtained oscillation frequency (in Hz) versus applied set-points for performing the calibration of the MEMS platform according to an exemplary aspect. As shown, a plurality of target set-point value P1-P7 can be fed by the calibration controller 410 to the microcontroller 310 during calibration and in sequence. In turn, the microcontroller 310 applies each set-point input to the non-inverting input of differential amplifier 330. The target set-point values P1-P7 can be predetermined and preselected voltage values that are selected by the manufacturer and stored in the memory of the calibration controller 410 to be used during the calibration of the oven controlled MEMS oscillator device 300.

For example, if a the set-point for the particular oven controlled MEMS oscillator device being manufactured is generally known to be around 1.0 volts, for example, the system administrator may select a voltage range of 0.8 to 1.2 volts for target set-point values P1-P7. In other words, in an example, P1=0.8 volts, P2=0.87 volts, P3=0.94 volts, P4=1.0 volts, P5=1.07 volts, P6=1.14 volts, and P7=1.2 volts. It should be appreciated that while seven values P1 to P7 are shown in this example, the manufacturer may select more or less values as needed to in order to achieve a successful calibration as should be understood to one skilled in the art. Thus, the voltage range and number of target set-point values is in no way limited to this specific example.

In any event, as described above, once a first target value P1 is fed to the microcontroller 310, the set point of the oven controlled MEMS oscillator will be adjusted to this value and applied as $P_{target}$ to the non-inverting input of differential amplifier 330. As described above, based on the feedback from temperature sensor 130, the control circuitry, which includes control logic 340, will then minimize the difference between the target value P1 and the temperature signal $T_{signal}$ as also described above.

The oscillation frequency measurement circuit 420 is then configured to measure an oscillation frequency fl of the resonator 120 that corresponds to the set-point value P1 during operation. This oscillation frequency (in Hz) is stored as a corresponding value as shown in FIG. 9. These steps are repeated for the plurality of set-point values (e.g., the seven set-point values P1 to P7) in order to generate the set-points to obtained frequency oscillation values vs. set-point curve as illustrated.

It should be appreciated that although multiple oscillation frequency measurements at different platform temperatures are needed to perform the calibrating procedure by the control circuitry described above, the calibration can be performed quickly as the thermal time constant for heating the MEMS platform is very short. Thus, each temperature point can be obtained in a short time of a few seconds or less. In contrast devices with longer thermal time constants (e.g., OCXOs that normally require 15 minutes for stabilizing the oven temperature) would require significant time (e.g., one hour or more) to perform the same calibration testing for a single device. As a result, the calibration method described herein provides a significant technical advantage for oven controlled MEMS oscillators especially when the device manufacturer needs to quickly calibrate hundreds or thousands of these devices during the manufacturing process.

By generating the oscillation frequency to set-point curve shown in FIG. 9, the calibration controller 410 is configured to determine the turnover target set-point for each device where the first derivative of the oscillation frequency with respect to set-point value is zero. This turnover target set-point can be selected as a target set-point operation value for the oven controlled MEMS oscillator during actual operation.

In the exemplary embodiment, the calibration controller 410 can be configured to perform a polynomial fit of the generated curve to identify where the set-point value is zero (i.e., at the peak of the curve as shown to be the "target set-point"). This identified target set-point value that corresponds to the turnover value for that particular MEMS platform is stored by calibration controller 410 in the non-volatile memory 320 of the oven controlled MEMS oscillator device 300. Thus, in operation during an actual application of the MEMS platform, the value for the turnover target set-point is read from the non-volatile memory and used as operational set-point to heat the heater 122 to the optimal temperature for operation of the MEMS platform 100, which results in the oven controlled MEMS oscillator having minimal oscillation frequency variations needed for high accuracy clock applications, as described above Thus, according to the exemplary calibration techniques described herein for the MEMS platform 100, the temperature related MEMS inaccuracies including thermistor variations, turn-over temperature variation, and heater resistance variation are all calibrated with a single calibration procedure without mechanical trimming of the MEMS device.

Figure 10A:
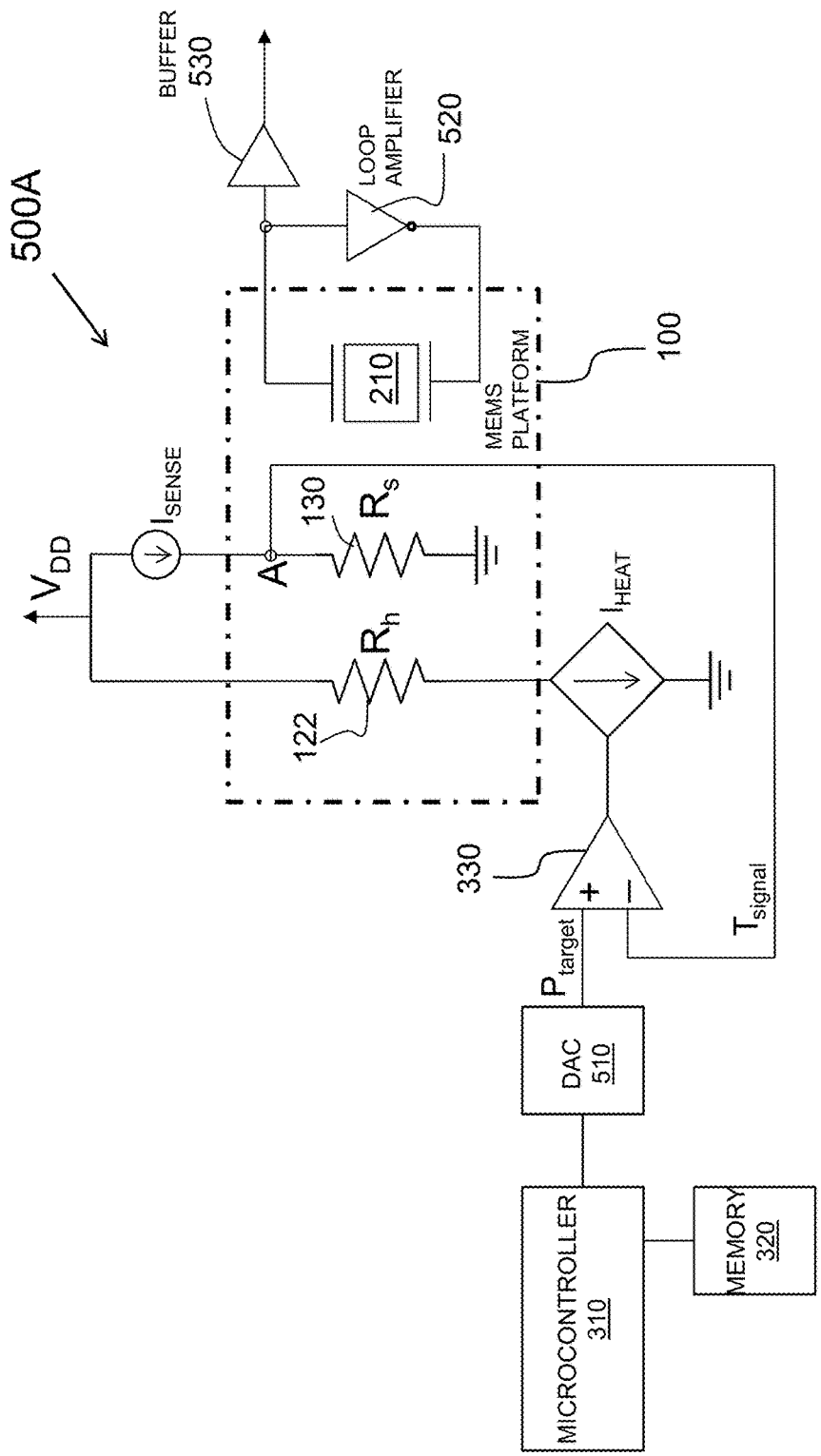
FIG. 10A illustrates a block diagram of an oven controlled MEMS resonator according to an exemplary embodiment.

FIG. 10A illustrates a block diagram of an exemplary embodiment of the oven controlled MEMS oscillator device 500A. The oven controlled MEMS oscillator device 500A shown in FIG. 10A is a detailed exemplary circuit diagram of the oven controlled MEMS oscillator device 300 shown in FIG. 7. Thus, although not shown, it should be appreciated that the device 500A of FIG. 10A can also be coupled to the external calibration control circuitry described above.

As shown, the oven controlled MEMS oscillator device 500A includes the MEMS platform 100 coupled to a voltage supply $V_{DD}$ with the temperature sensor 130 being a thermistor $R_s$ that is integrated onto the heated MEMS platform 100 together with the resonator 120 and the heater resistor 122 (i.e., resistor $R_h$). For temperature sensor measurement, a constant sense current $I_{sense}$ is passed from the voltage supply $V_{DD}$ through the thermistor $R_s$ and the voltage node A is monitored (i.e., a temperature voltage it output to differential amplifier 330), such that the measured voltage is output as $T_{signal}$ to the inverting input of differential amplifier 330 as shown and described above.

It should be appreciated that the resistance of the thermistor $R_s$ depends on the temperature of the MEMS platform 100 and hence the voltage at node A is the temperature signal $T_{signal}$. As further described above, the target platform value temperature is set by $P_{target}$ value provided by the microcontroller 310. In an exemplary aspect, the calibration target set-point values P1 to P7, for example, are fed from calibration controller 410 as digital voltage values. Thus, a digital-to-analog converter 510 is provided at the output of the microcontroller 310 to feed the converted target value to the non-inverting input of the differential amplifier 330 according to an exemplary aspect.

Thus, in this aspect, the differential amplifier 330 senses the difference between the $P_{target}$ value and $T_{signal}$ value, and the difference is used to adjust the heater current meat to effectively adjust the heat generated by heater 122 (i.e., resistor $R_h$). According to the exemplary aspect, the heater current $I_{heat}$ is controlled by a voltage controlled current source driving the difference towards a zero value as described above. As a result, the heater current will be proportional to the difference signal output from differential amplifier 330 as should be appreciated to one skilled in the art. Moreover, as further shown, the oscillation circuitry 210 can include a loop amplifier 520 and a memory buffer 430 configured to measure and store the oscillation frequencies of the MEMS platform 100 at the different set-point values P1 to P7 as described above. These measured values are then measured by the oscillation frequency measurement circuit 420, as described above, and plotted by the calibration controller 410 against each corresponding selected set-point value (see FIG. 9) to determine the optimal set-point for the oven controlled MEMS oscillator during operation.

Figure 10B:
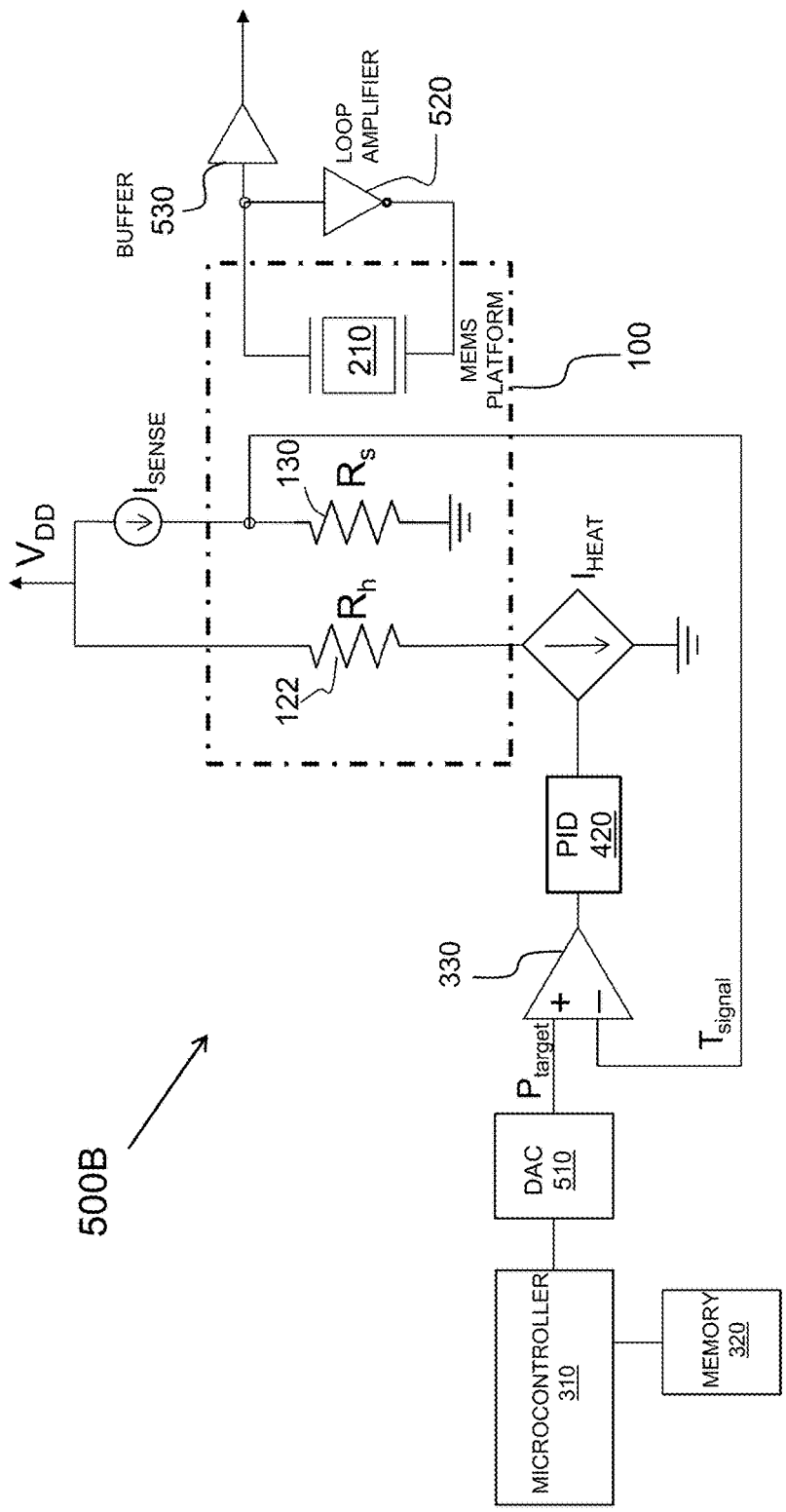
FIG. 10B illustrates a block diagram of an oven controlled MEMS resonator according to another exemplary embodiment.

FIG. 10B illustrates a block diagram of an alternative exemplary embodiment of the oven controlled MEMS oscillator device 500B according to an exemplary embodiment. In this embodiment, the heater current is adjusted using a PID controller 520 that minimizes the difference between $P_{target}$ value and $T_{signal}$ value. As should be appreciated to one skilled in the art, the PID controller 320 is a control loop feedback mechanism that can be configured to continuously calculate the difference between the desired set-point values and the measured process variable (i.e., the temperature measurement signal $T_{signal}$) and apply a correction based on proportional, integral, and derivative terms, as should be appreciated to one skilled in the art. Compared to the proportional controller in FIG. 10A, the additional of the PID controller improves control accuracy and speed. Those skilled in the art understand that there are many suitable closed loop control circuits in addition to proportional and PID controllers shown in FIGS. 10A and 10B.

Thus, according to the above exemplary aspects, the exemplary embodiments of the calibration control system 400 are configured to perform a calibration of the exemplary oven controlled MEMS oscillator devices through a sweep of predefined set-point values to measure correspond oscillation frequencies.

In an exemplary aspect, the control circuitry (i.e., the calibration controller 410) described above is configured to perform the calibration method. In particular, after manufacture of the oven controlled MEMS oscillator, the microcontroller 310 of the oven controlled MEMS oscillator device 300 will be temporarily connected to the calibration controller 410, as described above. The microcontroller 310 of the control circuitry is then configured by the calibration controller 410 to adjust the voltage set-point $P_{target}$ to a first target value P1 stored in memory 320. The control circuitry of the oven controlled MEMS oscillator device 300 will then minimize the difference between the target value P1 and the thermistor signal $T_{signal}$ to drive the set-point of the oven controlled MEMS oscillator to the selected target value, as described above. Moreover, the oscillation frequency fl corresponding to the first target value is measured by oscillation circuitry 210 and stored in memory, such as a lookup table.

These steps are repeated by microcontroller 310 for each subsequently selected target set-point value (e.g., values P2 to P7) fed by the calibration controller 410 to generate the obtained oscillation frequency vs. set-point curve, as described above and shown in FIG. 9, for example. Next, the calibration controller 410 is configured to perform a polynomial fit of the generated curve that can be used to determine the turnover set-point (i.e., the optimal target set-point for the particular oven controlled MEMS oscillator) where the first derivative of the oscillation frequency with respect to set-point value is zero. This target set-point value for the particular MEMS platform can then be stored by the calibration controller 410 in non-volatile memory 320 of that particular device. Thus, in subsequent operation of the oven controlled MEMS oscillator device 300, the stored set-point is used to maintain the resonator 120 at the turnover point, which minimizes oscillation frequency variations that would other be experienced by oven controlled MEMS oscillators due to manufacturing variations as described above.

It is noted that there are many possible variations to the exemplary embodiments described above. For example, the temperature signal $T_{signal}$ may be obtained from the thermistor by incorporating the thermistor as part of Wheatstone bridge. In another exemplar, the heater 122 is driven by a controlled voltage source instead of current source $I_{heat}$ as also described above. It should be appreciated that such variations in the system configuration should be appreciated to one skilled in the art and that the exemplary embodiments described above are not limited to the specific implementations described herein.

Moreover, it should be appreciated that the exemplary calibration system provides many technical advantages. Since the heated MEMS platform 100 has a small thermal mass (compared with OCXOs, for example), the time constant for heating and cooling is also very small. As a result, the resonator 120 can be heated to the target temperature in 100 ms or less. The small thermal time constant enables both short calibration time and fast start-up time. As a result, each target temperature and corresponding oscillation frequency can be generated and measured in a very short period of time. Moreover, the electronic calibration procedure eliminates many error sources that could otherwise require costly mechanical trimming. The single calibration step for the whole system (rather than individual components within the oven controlled MEMS oscillator, for example, only resonator 120) described above eliminates both circuit related errors and resonator element errors.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST

100: MEMS resonator device
110: substrate layer
112: frame
114: resonator cap
116A-116D: electrical contact pads
120: resonator
122, 222: heater
124A & 124B: support beams
126A & 126B: anchor beams
128: cavity
130, 230: thermistor
132: metal bonding ring
134: heated platform
136: via contacts
140A, 140B: cavities
142: silicon dioxide layer
144: AlN layer 146: electrode
200: timing device
210: oscillation circuitry
220: wire bond
240: outer oven lid
250: carrier
300: oven controlled MEMS oscillator device
410: calibration controller
420: oscillation frequency measurement circuitry
510: Digital-to-analog converter
520: loop amplifier
530: buffer

The invention claimed is:

1. A calibration system for an oven controlled MEMS oscillator, the calibration system comprising:
a frame;
a platform disposed inside the frame and anchored to the frame by at least one support beam with cavities disposed between the frame and the platform;
a MEMS oscillator anchored to the platform;
control circuitry including at least one processor configured to separately select each of a plurality of predetermined target set-point values and to control a heater of the oven controlled MEMS oscillator to adjust a set-point of the oven controlled MEMS oscillator based on each of the selected predetermined target set-point values; and
an oscillation measurement circuit configured to measure respective oscillation frequencies of the oven controlled MEMS oscillator at each adjusted set-point corresponding to each of the selected predetermined target set-point values,
wherein the control circuitry is configured to determine a target set-point operation value based on the measured oscillation frequencies and to calibrate the oven controlled MEMS oscillator based on the determined target set-point operation value.

2. The calibration system according to claim 1, further comprising an electronic memory configured to store the plurality of predetermined set-point target values.

3. The calibration system according to claim 1, further comprising a heat control circuit configured to control the heater based on a difference between each of the selected predetermined target set-point values and a temperature measurement signal output by a temperature sensor inside the oven controlled MEMS oscillator.

4. The calibration system according to claim 3, wherein the temperature sensor is a thermistor and the temperature measurement signal is a temperature voltage measured across the thermistor.

5. The calibration system according to claim 4, wherein the heat control circuit is a differential amplifier configured to output a difference between the temperature measurement signal and the respective selected predetermined target set-point value.

6. The calibration system according to claim 5, wherein the control circuitry comprises a control loop to control the heater to minimize a difference between the temperature measurement signal and the respective selected predetermined target set-point value to drive a heater current applied to the heater.

7. The calibration system according to claim 3, wherein the heat control circuit is a proportional-integral-derivative (PID) controller configured to control the heater based on the difference between each of the selected predetermined target set-point values and the temperature measurement signal.

8. The calibration system according to claim 3, wherein the MEMS oscillator resonator, the temperature sensor, and the heater are disposed on the platform with the cavities separating the MEMS oscillator resonator, the temperature sensor, and the heater from the frame.

9. The calibration system according to claim 1, wherein the control circuitry is configured to:
determine the target set-point operation value by generating a curve of the measured oscillation frequencies versus and the corresponding selected predetermined target set-point values, and
perform a polynomial fit of the generated curve to identify the target set-point operation value as the set-point value equaling zero in the polynomial fit.

10. The calibration system according to claim 9, wherein the control circuitry is configured to calibrate the oven controlled MEMS oscillator by storing the determined target set-point operation value in non-volatile memory of the oven controlled MEMS oscillator, such that the heater of the oven controlled MEMS oscillator is controlled to heat the oven controlled MEMS oscillator during operation based on the determined target set-point operation value.

11. The calibration system according to claim 1, wherein the temperature sensor is configured to output a temperature measurement signal to control the heater with each of the selected predetermined target set-point values.

12. The calibration system according to claim 11, wherein the resonator is bulk acoustic mode resonator.

13. An oven controlled MEMS oscillator device comprising:
a frame;
a silicon platform disposed inside the frame and anchored to the frame by at least one support beam with cavities disposed between the frame and the silicon platform;
a resonator coupled to the silicon platform;
a temperature sensor coupled to the silicon platform and configured to output a temperature measurement signal during operation of the oven controlled MEMS oscillator device;
a heater coupled to the platform and configured to heat the oven controlled MEMS oscillator device based on a heat control signal;
non-volatile electronic memory configured to store a target set-point; and
a heat control circuit configured to generate the heat control signal based on a difference between the stored target set-point value and the temperature measurement signal output from the temperature sensor,
wherein the heat control circuit is configured minimize the heat control signal by adjusting the heater to minimize the difference between the stored target set-point value and the temperature measurement signal.

14. The oven controlled MEMS oscillator device according to claim 13, wherein the temperature sensor is a thermistor and the temperature measurement signal is a temperature voltage measured across the thermistor.

15. The oven controlled MEMS oscillator device according to claim 14, wherein the heat control circuit is a differential amplifier configured to output the difference between the temperature measurement signal and the stored target set-point value.

16. The oven controlled MEMS oscillator device according to claim 15, wherein the heat control circuit and the differential amplifier comprise a control loop configured to control the heater to minimize a difference between the temperature measurement signal and the stored set-point value to drive the heater to heat the resonator.

17. The oven controlled MEMS oscillator device according to claim 13, wherein the heat control circuit is a proportional-integral-derivative (PID) controller configured to control the heater based on the difference between the stored target set-point value and the temperature measurement signal.

18. The oven controlled MEMS oscillator device according to claim 13, wherein the resonator, the temperature sensor, and the heater are disposed on the platform with the cavities separating the MEMS oscillator resonator, the temperature sensor, and the heater from the frame.

19. A method for calibrating an oven controlled MEMS oscillator, the method comprising:
   separately selecting each of a plurality of predetermined target set-point values;
   controlling a heater in the oven controlled MEMS oscillator to adjust a set-point of the oven controlled MEMS oscillator based on each of the selected predetermined target set-point values, with the oven controlled MEMS oscillator being anchored to a platform that is anchored to a frame by at least one support beam with cavities disposed between the frame and the platform;
   measuring, by an oscillation measurement circuit, respective oscillation frequencies of the oven controlled MEMS oscillator at each adjusted set-point corresponding to each of the selected predetermined target set-point values;
   determining a target set-point operation value based on the measured oscillation frequencies; and
   calibrating the oven controlled MEMS oscillator based on the determined target set-point operation value.

20. The calibrating method according to claim 19, further comprising:
   outputting a temperature measurement signal by a temperature sensor inside the oven controlled MEMS oscillator; and
   controlling the heater in the oven controlled MEMS oscillator to minimize a difference between the temperature measurement signal and the currently selected predetermined target set-point value to drive the heater to heat the oven controlled MEMS oscillator.

21. The calibrating method according to claim 20, further comprising:
   determining the target set-point operation value by generating a curve of the measured oscillation frequencies versus and the corresponding currently selected predetermined target set-point values, and
   performing a polynomial fit of the generated curve to identify the target set-point operation value as the set-point value equaling zero in the polynomial fit.

22. The calibrating method according to claim 21, further comprising calibrating the oven controlled MEMS oscillator by storing the determined target set-point operation value in non-volatile memory of the oven controlled MEMS oscillator, such that the heater of the oven controlled MEMS oscillator is controlled to heat the oven controlled MEMS oscillator during operation based on the determined target set-point operation value.

23. The calibrating method according to claim 20, wherein the MEMS oscillator resonator, the temperature sensor, and the heater are disposed on the platform with the cavities separating the MEMS oscillator resonator, the temperature sensor, and the heater from the frame.

* * * * *